United States Patent [19]

Schenz et al.

[11] Patent Number: 5,270,650

[45] Date of Patent: Dec. 14, 1993

[54] NON-DESTRUCTIVE DETECTION OF SPOILAGE USING NUCLEAR MAGNETIC RESONANCE SPECTROSCOPY

[75] Inventors: Timothy W. Schenz, Powell; Kecia L. Courtney, Columbus; Braden R. Israel, Zanesville; Lisa A. Reaves, Bexley, all of Ohio

[73] Assignee: Abbott Laboratories, Abbott Park, Ill.

[21] Appl. No.: 897,138

[22] Filed: Jun. 11, 1992

[51] Int. Cl.$^5$ ............................................. G01R 33/20
[52] U.S. Cl. ..................................... 324/308; 324/300
[58] Field of Search ........................ 324/308, 300, 309; 73/52; 426/231

[56] References Cited

U.S. PATENT DOCUMENTS

| | | | |
|---|---|---|---|
| 3,966,973 | 6/1976 | Henry et al. | 324/307 |
| 4,701,705 | 10/1987 | Rollwitz | 324/307 |
| 5,049,819 | 9/1991 | Dechene et al. | 324/307 |

OTHER PUBLICATIONS

"Nondestructive Detection of Corebreak in Bartlett Pears with Nuclear Magnetic Resonance Imaging", Wang et al. Hort Science 24(1), Feb. 1989.

"Magnetic resonance imaging application in food research", McCarthy, et al. *Trends in Food Science & Technology*, Dec. 1990, pp. 134–139.

"Use of Magnetic Reasonance Procedures for Measurement of Oil in French-Style Dressings", Heil et al., *Journal of Food Science*, vol. 55, No. 3, pp. 763, 764,884 Mar. 1990.

"Application of the NMR Method to evaluate the Oxidative Deterioration of Crude & Stored Fish Oils", Saito et al., *Agricultural & Biological Chemistry*, 54(2), pp. 534–535 Feb. 1990.

Primary Examiner—Michael J. Tokar
Assistant Examiner—Raymond Y. Mah
Attorney, Agent, or Firm—Lonnie R. Drayer; Donald O. Nickey

[57] ABSTRACT

A non-destructive spoilage detection method of detecting spoilage of a nutritional product having a water activity of at least 0.9 has the steps of: subjecting a nutritional product in a non-metallic sealed container to nuclear magnetic resonance spectroscopy followed by recording the peak free induction decay value associated with an initial nuclear magnetic resonance spectroscopy of the nutritional product. Subsequently the nutritional product is subjected to nuclear magnetic resonance spectroscopy and at least one other peak free induction decay value associated with the nuclear magnetic resonance spectroscopy of the nutritional product is recorded. Over time, at least two of the peak free induction decay values are compared from which a determination is made whether spoilage of the nutritional product is indicated. Preferably subjection of the nutritional product to nuclear magnetic resonance spectroscopy occurs on a regular basis and at approximately the same temperature of the nutritional. Ideally, the nutritional product has been packaged using aseptic processing.

12 Claims, 6 Drawing Sheets

○ CONTROL
△ BACILLUS CIRCULANS
□ BACILLUS MEGATERIUM

□ INTROLITE®
○ ENSURE PLUS™
△ ISOMIL®
▽ SIMILAC®

□ pH
○ % FID SIGNAL CHANGE

NON-DESTRUCTIVE DETECTION OF SPOILAGE USING NUCLEAR MAGNETIC RESONANCE SPECTROSCOPY

TECHNICAL FIELD

The present invention relates generally to the providing of a non-destructive method for the detection of spoilage in a nutritional product and the like, and more particularly, to such a method which utilizes nuclear magnetic resonance spectroscopy.

BACKGROUND ART

Quality control is extremely important in the food service industry. Food manufacturers spend substantial amounts of money to ensure that their packaged nutritional products, including pediatric and medical nutritional products, are not contaminated.

There are two distinct methods of sterilization currently in use. The first method involves the use of a retort process. Utilization of this method features the introduction of the food product into a container, which container then is subjected to extremely high retort temperatures which effectively kill all the micro organisms which may have been in the sealed unsterilized container. Once a food product has been subjected to the retort process, it should be commercially sterile, provided there are no problems with improper processing or container damage during the sterilization process.

The second type of sterilization involves aseptic processing and packaging. Aseptic processing and packaging has become established as a feasible method for the manufacture of sterilized nutritional product. However, the microbiological quality of products manufactured using this technique requires strict control. Under this process, sterile product is brought into contact with a sterile container in a sterile zone. The sterile zone has an air overpressure with sterile air that is usually HEPA filtered.

The key advantage associated with the aseptic method concerns the improved nutritional content of the product. Subjecting a nutritional product to retort or terminal sterilization can result in a change of flavor, or a change in color under such high heat treatment. Although aseptic packaging overcomes such problems, sterility becomes more of an issue. This is because products packaged using the aseptic process are more suspectible to contamination because of the nature of the process.

The key disadvantage associated with aseptic processing and packaging is that the presence of even one microbe in an aseptic packaged product may result in the contamination of the entire product, whereas the presence of one microbe in a sealed container subsequently subjected to retort usually results in the killing of the microbe.

A tacit acknowledgment of the problems associated with aseptic packaging is the fact that oftentimes, aseptically packaged nutritional products are placed in a refrigerated environment. Although in theory the fact that the product has been aseptically packaged should result in the product not spoiling, companies which provide nutritional products packaged using aseptic procedures will recognize the fact that if even one microbe is introduced into the packaged material, then contamination can exist. Therefore, by keeping the nutritional product in a refrigerated environment, hopefully any such contamination, if it exists, will be minimized. The concern is heightened as aseptic processing becomes more low acid. Thus, it can be appreciated that the need exists for a non-destructive testing of an aseptic packaged product in order to further provide assurance that the nutritional product is not undergoing spoilage.

Quality control is extremely important as it relates to the sterility of nutritional products. A number of various methods of detecting spoilage exist; however, there are significant drawbacks associated with them. As used herein and in the claims, a non-destructive method of detecting spoilage is a method which does not require the opening of a container in order to test the nutritional product contained therein. A destructive method is one which requires the opening of the container in order to test the nutritional product contained therein.

One prior art test for sterility is the pH drop test. This test measures the nutritional product for evidence of a drop in the pH between the time when the product produced and the time when the product is tested. Evidence of a drop in pH often indicates that the product is not sterile and that the product is encountering the growth of bacteria or other microorganisms. There are two disadvantages associated with pH drop tests. The first is that the test is a destructive test. The second disadvantage is that this test is typically conducted, due to time constraints, on a limited number of containers per batch. This method is not routinely used for commercial product batches. It is usually incorporated for production line start up procedures or new product start up.

Another test for sterility involves a visual inspection of the product, provided the container walls are either transparent or at least translucent. The obvious disadvantages associated with this test include the fact that sometimes contaminated product will not appear visually different than sterile product, that this method is labor intensive and consequently inefficient in testing large numbers of containers, and that if the container is made of metal, is not translucent, or has a label affixed to the container such that the nutritional product is not visible, the results of any attempted visual inspection of the product leave a great deal to be desired.

Yet another test is known as the BACTEC sterility test. This test utilizes a subculture method that evaluates a small batch sample, typically numbering eight to ten per batch or sterilizer load. In practice, the fact that a subculture does not indicate a problem is interpreted as evidence that the entire batch or load has no problems with sterility.

Still another test is known as the leak test, which only indicates the potential of a non-sterile package. This test is conducted in a vacuum and detects the presence of flush gas immediately after the container comes off the sterilization line. In theory, testing for the presence of a flush gas, such as nitrogen in the case of aseptic packaging, will provide an indication that there is a leak in the container which could facilitate contamination. In reality though, this test is not fool proof.

Another test involves spinning the container for indications of an increase in viscosity of the product. However, interpreting the results of this test is often too subjective. Yet another test is known as the PECO test, which detects the presence of a dome being formed in the container due to spoilage. However, often the container may appear fine, while the nutritional product is actually contaminated.

Yet another method of testing for sterility involves shaking of the container. Once again, the theory is that any gelation which occurs due to contamination will be felt in the shaking process. However, since not all spoilage results in gelation, this test is of limited applicability. Furthermore, the test is extremely subjective.

Given the problems associated with the many tests which have been utilized in connection with testing for sterility, manufacturers of nutritional products have endeavored to develop more efficient tests. An example of this research resulted in an attempt to apply ultrasonic imaging to the assessment of micro-biological quality of aseptically packed starch soup. Research concluded that a non-destructive method using ultrasound imaging resulted in a method appropriate for use in quality control schemes for starch-based foods. However, ultrasound testing has several disadvantages. First, the ultrasonic method is very dependent on gelation or viscosity-build up. This is the principal behind its ability to detect spoilage. Second, the method is somewhat time consuming, as well as relatively expensive. Third, this method of testing requires either good acoustic contact with, or water immersion of, the container.

The present invention relates to the utilization of nuclear magnetic resonance spectroscopy (NMR) to detect spoilage in a nutritional product. Nuclear magnetic resonance spectroscopy is based on the measurement of resonant radio frequency adsorption by nuclear spins in the presence of an applied magnetic field. In NMR an object is placed in an applied static magnetic field. The nuclei in the molecules of the sample generate a bulk microscopic magnetization. Once generated, this magnetization can be perturbed by a second field which is oscillating at an appropriate radio frequency. This perturbation of the magnetization generates the nuclear magnetic resonance spectrum. There are two basic types of NMR, the wide-line or frequency-sweep method and the pulsed or transient response method. The frequency-sweep method is analogous to tuning a piano note by note, striking each note and listening to the response. In continuous wave spectroscopy, the disturbance of the magnetization is monitored as either the radio frequency is varied or the applied field is swept. In each case only a single frequency is excited and detected at any one moment. In pulsed nuclear magnetic resonance spectroscopy (PNMR) the pulsed measurement is comparable to all the keys of a piano being struck at once, with the response of each note extracted from the total sound.

In pulsed NMR a large permanent magnetic field is applied to a sample. The magnetic field should be as homogenous as possible so as to apply a uniform magnetization to the sample. A pulse is applied by a rotating magnetic field at right angles to the large permanent field. This causes the spin nuclei being probed to become aligned in a single direction. The rotating field is generated through a tuned coil and consists generally of a burst or pulse of radio frequency energy. This radio frequency pulse rotates the magnetization of the sample. After the pulse has been applied, the spin system tends to return to its equilibrium position in the large permanent field through dephasing. After the equilibrium magnetization is re-established, the radio frequency pulse may be repeated. The induced voltage generated by the spin dephasing process is monitored by a resonant radio frequency coil.

An important aspect of nuclear magnetic resonance spectroscopy is the signal known as a free induction decay (FID). FID is caused by the magnetization of the object returning to equilibrium, and the consequent "decaying" of the NMR signal. The decaying signal is also referred to as a "transient". An FID signal can readily be ascertained from the PNMR method. Additionally, with modern instruments and computers it is also possible to obtain an FID signal from the frequency sweep method by performing an inverse Fourier Transform (FT) on the data generated.

The theory and application of NMR in connection with nutritional products focuses on particular qualities associated with nutritional products. A major advantage of NMR is that it is neither invasive nor destructive. Consequently, nutritional products still sealed in their original non-magnetic containers, such as glass or plastic bottles, may be analyzed without detriment to either sterility or wholesomeness. For example, NMR has been utilized to facilitate measurement of the influence of dispersion and composition on fat nucleation and crystallization in food such as biscuits, emulsions and confectionery products. Such tests enable the manipulation of the content and physico-chemical properties of fat so as to optimize taste, texture and nutritional quality of various foods. "Magnetic resonance imaging application in food research", McCarthy et al., *TRENDS IN FOOD SCIENCE & TECHNOLOGY*, December 1990, pp. 134-139.

Yet still further, NMR has been used for the estimation of fat content in pork and beef carcasses, determination of water core distribution in apples, for the detection of bruising in apples, onions and peaches, and for the detection of worm damage in pears. Still further, NMR has been utilized to test for the maturity of tomatoes and avocados.

Additionally, NMR has been utilized with respect to oxygen-dependent core breakdown in Bartlett pears and the deterioration of apples during storage. NMR has also been utilized to quantitatively test for oil content in salad dressings. "Use of Magnetic Resonance Procedures for Measurement of Oil in French-style Dressings", Heil et al., *JOURNAL OF FOOD SCIENCE*, Vol. 55, No. 3, pp 763, 764, 884 (1990). NMR has also been used to evaluate the oxidative deterioration of crude and stored fish oils. "Application of the NMR Method to Evaluate the Oxidative Deterioration of Crude and Stored Fish Oils", Saito, et al., *AGRICULTURAL AND BIOLOGICAL CHEMISTRY*, 54(2), pp 535-534 (1990). Furthermore, NMR has been applied to measurements of moisture in a variety of products. These include wheat, oats, rice, sugar, starch and its derivatives, candy, corn, skimmed milk powder, and flour.

Despite the varied uses for which NMR and PNMR have been applied, none of them appear to have been related to the determination of spoilage of a nutritional product. Instead, as has been observed above, the usage of NMR or PNMR has been with respect to a quantitative value, such as the percentage of oil in a salad dressing, or the percentage of water in a food product.

It is thus apparent that the need exists for an improved non-destructive method for the detection of spoilage in a nutritional product and the like.

DISCLOSURE OF THE INVENTION

The present invention provides a non-destructive method of detecting spoilage of a nutritional product having a water activity of at least 0.9 which permits the inspection of nutritional products in sealed containers to be accomplished in an extremely efficient manner, while at the same time being extremely reliable. In this method, spoilage of a nutritional product is indicated by a trend towards an increase in the relaxation rate of the protons associated with the nuclear magnetic resonance spectroscopy of the nutritional product. Preferably, the relaxation rate parameter is the free induction decay signal.

There is disclosed a non-destructive method of detecting spoilage in a nutritional product comprising the steps of: (a) providing a non-metallic sealed container containing a nutritional product having a water activity of at least 0.9; (b) subjecting the nutritional product in the sealed container to nuclear magnetic resonance spectroscopy and determining the peak free induction decay value associated with the nutritional product; (c) subjecting said nutritional product to subsequent nuclear magnetic resonance spectroscopy and obtaining at least one other peak free induction decay value associated with the nuclear magnetic resonance spectroscopy of the nutritional product; and (d) determining based on a comparison of the values between the sample and the subsequent spectroscopy whether spoilage of the nutritional product is indicated. Further, according to the method of the present invention, preferably each time the nutritional product is subjected to nuclear magnetic resonance spectroscopy the temperature of the nutritional product is the same as it was at the time of the initial subjection of the nutritional product to nuclear magnetic resonance spectroscopy and/or the temperature is the same as that at which a spoilage free control sample of the nutritional product when subjected to nuclear magnetic resonance spectroscopy. Still further, spoilage of the nutritional product is indicated by a trend towards a decline in the peak free induction decay values.

There is also disclosed a non-destructive method of detecting spoilage in a nutritional product having a water activity of at least 0.9, the method comprising the steps of: (a) providing a non-metallic sealed container containing a nutritional product having a water activity of at least 0.9; (b) subjecting the nutritional product in the sealed container to nuclear magnetic resonance spectroscopy and determining a peak free induction decay value of the nutritional product; (c) subsequently subjecting said nutritional product to nuclear magnetic resonance spectroscopy in measuring at least one other peak free induction decay value associated with nuclear magnetic resonance spectroscopy of the nutritional product; (d) comparing the peak free induction decay values obtained from measurement of the nutritional product with peak free induction decay values associated with at lease one control sample of the nutritional product which is free of spoilage; and (e) determining based on the comparison of the values between the control sample and the subsequent spectroscopy, whether spoilage of the nutritional product is indicated.

There is also disclosed a non-destructive method of detecting spoilage in a nutritional product comprising the steps of: (a) providing a sealed non-metallic container containing a nutritional product having a water activity of at least 0.9; (b) subjecting the nutritional product in the sealed container to nuclear magnetic resonance spectroscopy and measuring the relaxation rate of the protons associated with the nutritional product; (c) comparing the values obtained from measurement of said nutritional product with values associated with at least one control sample of the nutritional product which is free of spoilage; and (d) determining based on the comparison whether spoilage of the nutritional product is indicated.

Other objects and advantages of the invention will be apparent from the following description, the accompanying drawings, and the appended claims.

DETAILED DESCRIPTION OF THE INVENTION

The method of detecting spoilage of a nutritional product according to the present invention may be employed with nutritional products having a water activity of at least 0.9. As used herein and in the claims "water activity" is understood to refer to a measure of free water in a nutritional product as determined for example with a Beckman Hygroline Indicator, Model Number HTCI-2, distributed by Beckman Instruments.

Figure 6:
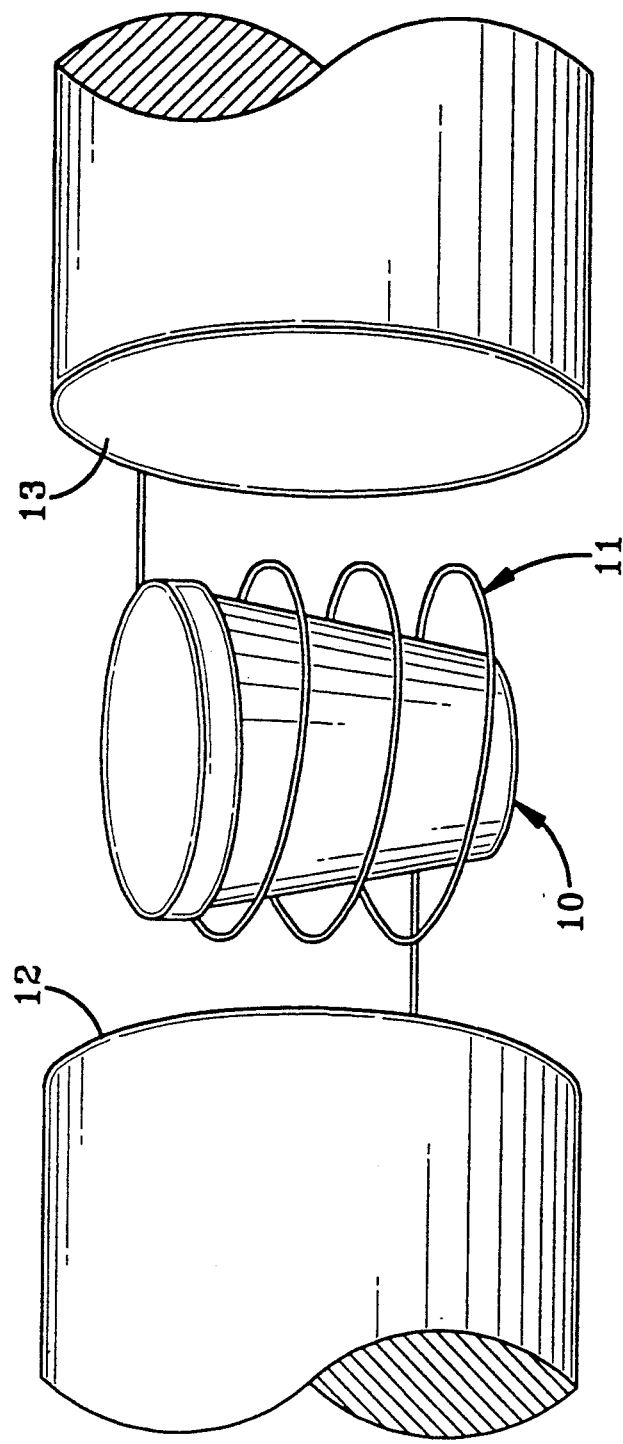
FIG. 6 is pictorial representation of the nuclear resonance spectroscopy procedure employed in the practice of the present invention.

The nutritional product may have been packaged and then sterilized, or alternatively the nutritional product may have been packaged using aseptic packaging technology. The container should be made of one, or more, non-metallic materials, so that the container will not interfere with nuclear magnetic resonance spectroscopy of the nutritional product. The sealed container and the nutritional product are repeatedly subjected to nuclear magnetic resonance spectroscopy to determine changes in the product which may indicate spoilage. With reference of FIG. 6 a sealed non-metallic container 10 containing a nutritional product having a water activity of at least 0.9 is placed within an NMR RF coil 11 which is disposed between a pair of NMR magnets 12, 13.

EXAMPLE I

Figure 1:
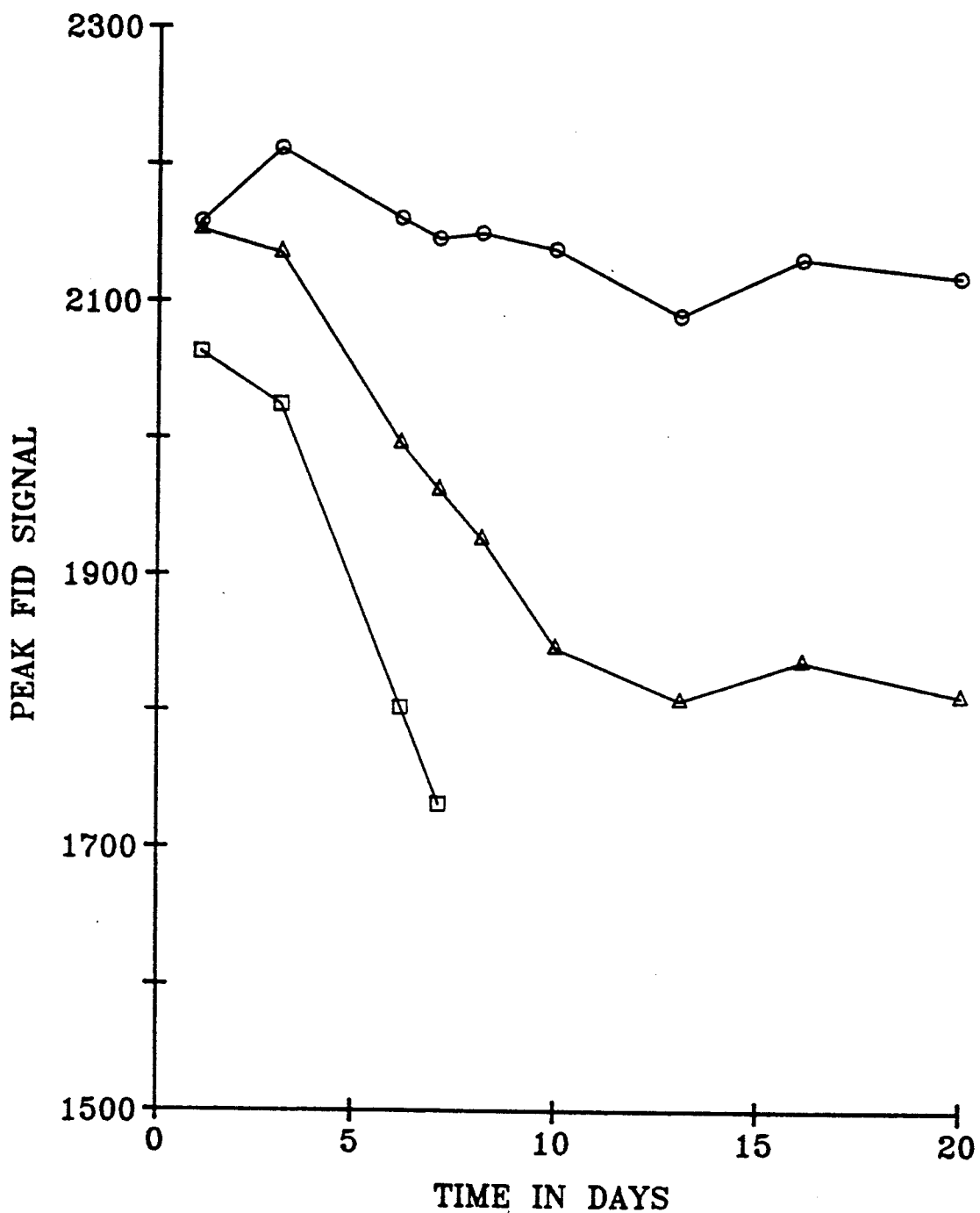
FIG. 1 is a graph of peak FID signal plotted over time for three samples of a nutritional product.

FIG. 1 presents test results for a sterile control sample of Similac ® Ready-To-Feed nutritional product which was subjected to PNMR. Similac ® is a cow's milk formula liquid food for infants which is manufactured and distributed by Ross Laboratories, a division of Abbott Laboratories, U.S.A.. The NMR procedures described in all of the examples herein were conducted by sealing product samples in autoclovable plastic tubes and then subjecting the samples to NMR with a PRAXIS II ANALYZER from The Praxis Corporation of San Antonio, Tex. While this model is no longer available, a comparable NMR device is the MINISPEC 20 which is distributed by Bruker Spectrospin (Canada), Ltd., Milton, Ontario, Canada. FIG. 1 also shows peak free induction decay measurements associated with Similac ® Ready-To-Feed samples which had been contaminated with three colony forming units of *Bacillus megaterium* and with four colony forming units of *Bacillus circulans*. In FIG. 1, the peak free induction decay (FID) values are plotted along the Y-axis, while time in days is plotted along the X-axis. The *Bacillus megaterium* contaminated sample was monitored for approximately 7 days, at which time it provided visual indication of spoilage. The control sample and the *Bacillus circulans* sample were monitored for 20 days. At the end of 20 days of monitoring samples contaminated with *Bacillus circulans* showed no visible signs of spoilage.

However, as can be observed from the plotted points in the graph of FIG. 1 which points correspond to the peak FID values on various days, a trend was visible towards a decline in the peak FID values. Based upon the method of the present invention, such a trend is indicative of spoilage in the nutritional product. Thus, even when a nutritional product is not visibly spoiled, the method of the present invention provided for the non-destructive detection of spoilage in a nutritional product.

EXAMPLE II

Figure 2:
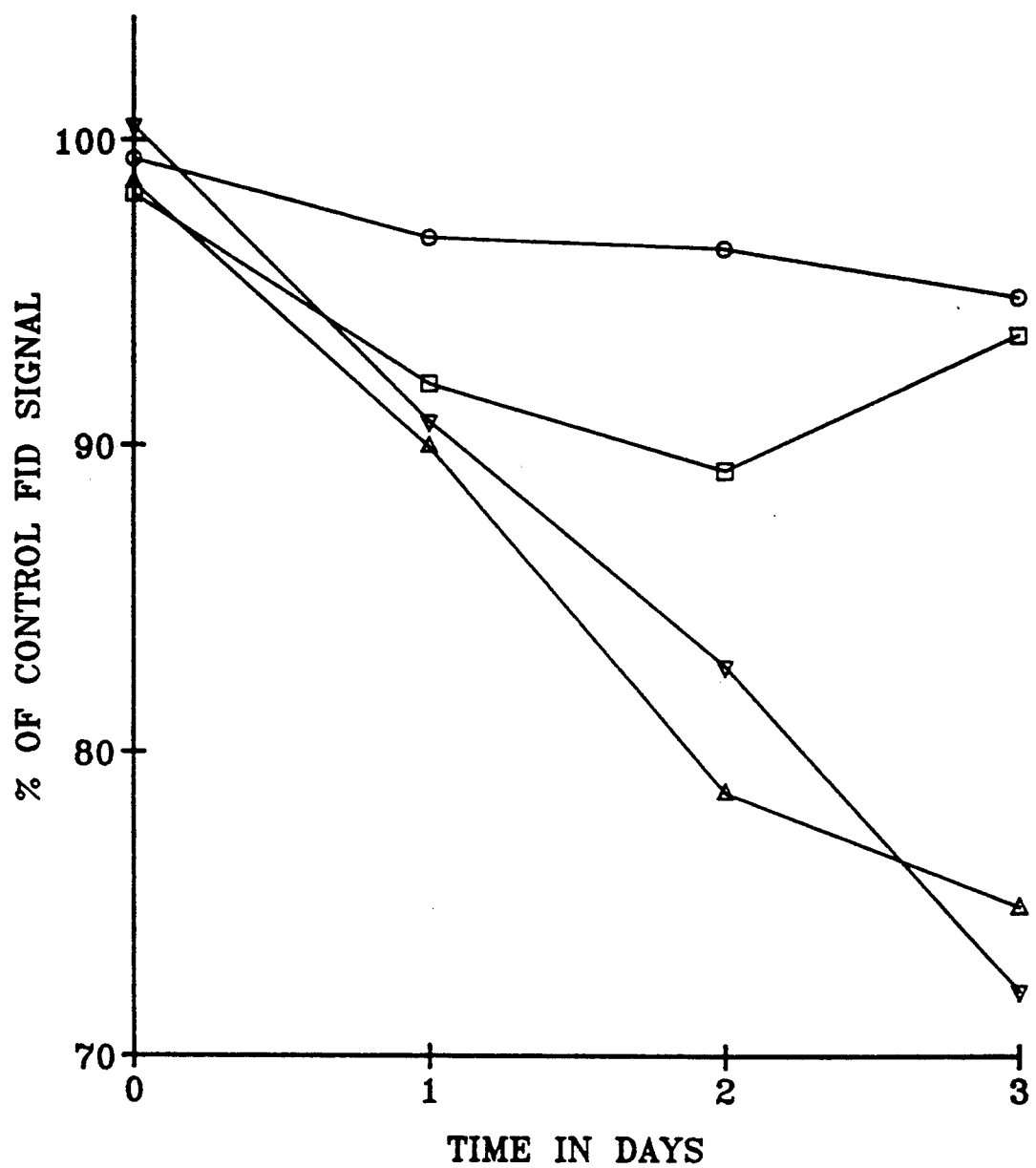
FIG. 2 is a graph of the percentage of control signal plotted against time in days associated with the FID signals of four nutritional products.

To verify that a contaminated nutritional product results in a decreased FID signal due to spoilage, experiments were conducted using four liquid nutritional products, Ensure Plus ®, Introlite TM, Isomil ®, and Similac ®, all of which are available from Ross Laboratories, a division of Abbott Laboratories, U.S.A., Columbus, Ohio U.S.A. Ensure Plus ® is a high-calorie liquid food providing complete balanced nutrition for persons who are nutritionally depleted and who may not be able to tolerate large-volume intakes. Introlite TM is a fortified, half-calorie liquid food for introductory tube feeding. Isomil ® is a soy protein formula liquid food for infants, children and adults with an allergy or sensitivity to cow's milk. Similac ® was described in Example I. Containers of each of these four products were contaminated with *Bacillus megaterium* following aseptic transfer. The results can be seen in FIG. 2 which presents the decreased FID signal associated with each nutritional product as a percentage of the control signal associated with an uncontaminated nutritional product over a period of three days. While the decline in FID is fairly slight with respect to a nutritional product, such as Ensure Plus ®, significant decreases in FID signal were shown to be associated with Isomil ® and Similac ®. Furthermore, over time, a significant decrease in FID signal was shown to be associated with Ensure Plus ®.

EXAMPLE III

Figure 3:
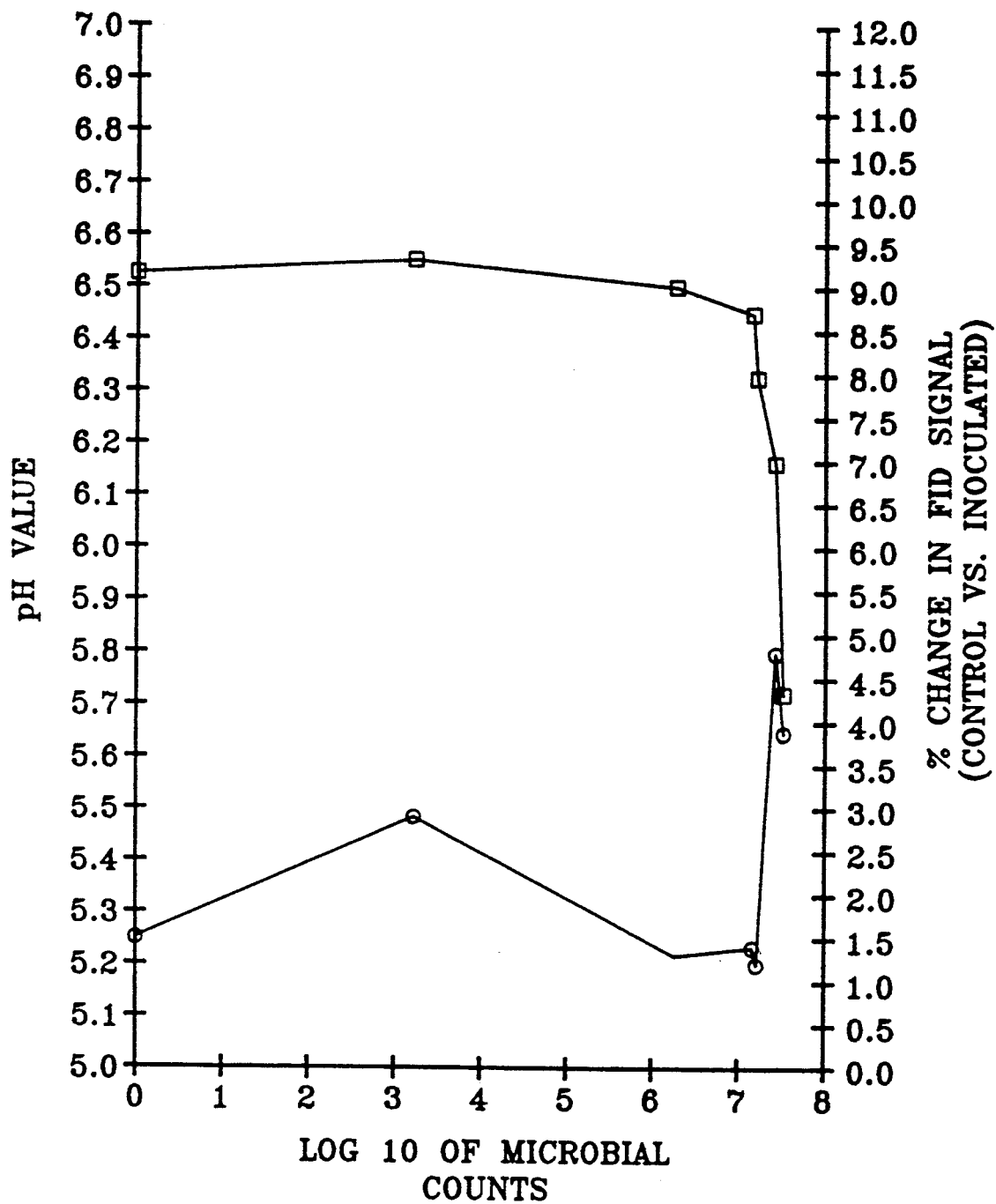
FIG. 3 is a graph presenting the percentage decrease in free induction decay signal compared to microbial count, as well as pH compared to microbial count for the same nutritional product.
Figure 4:
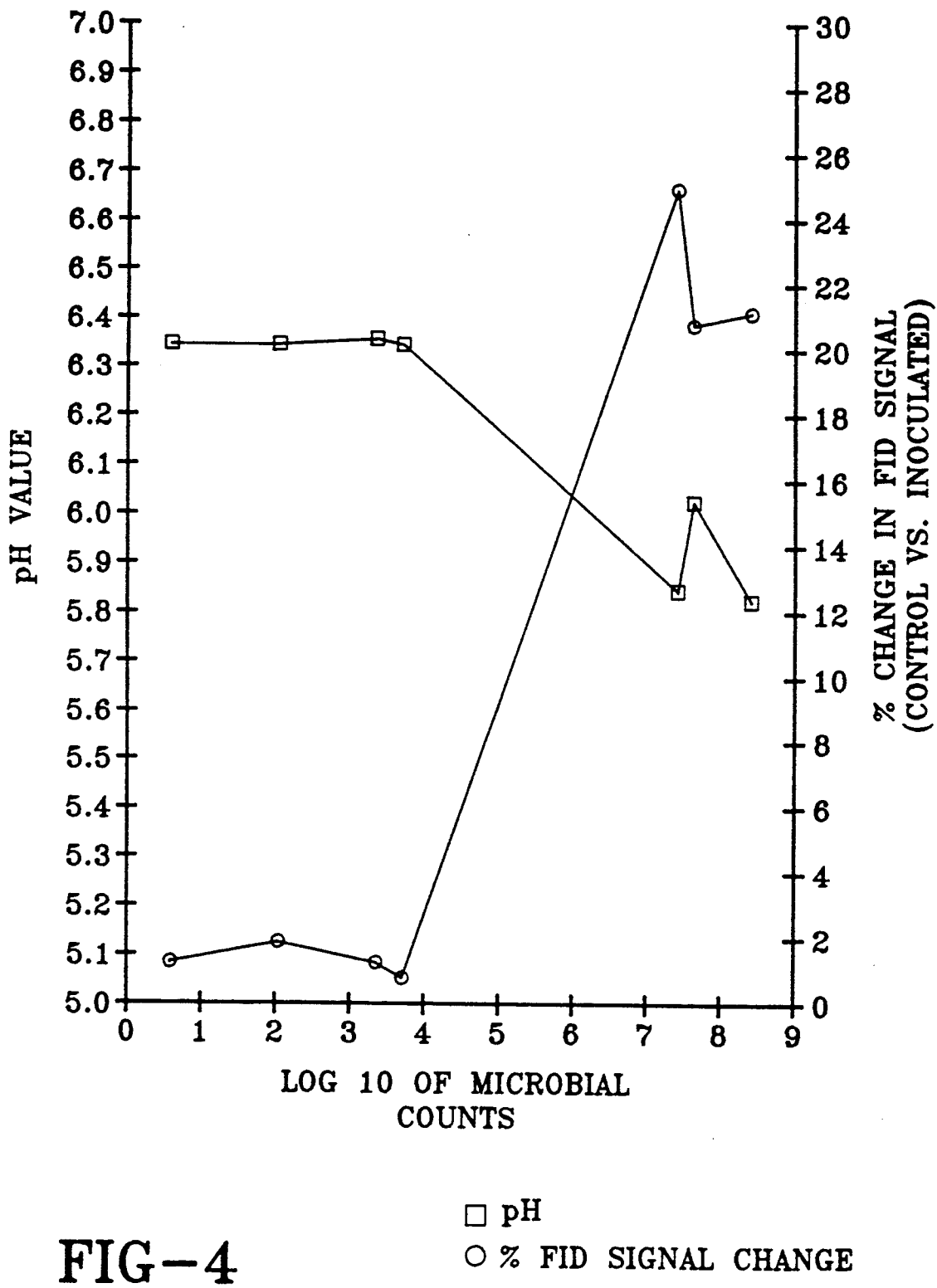
FIG. 4 is a graph presenting the percentage decrease in free induction decay signal compared to microbial count, as well as pH compared to microbial count for a second nutritional product.
Figure 5:
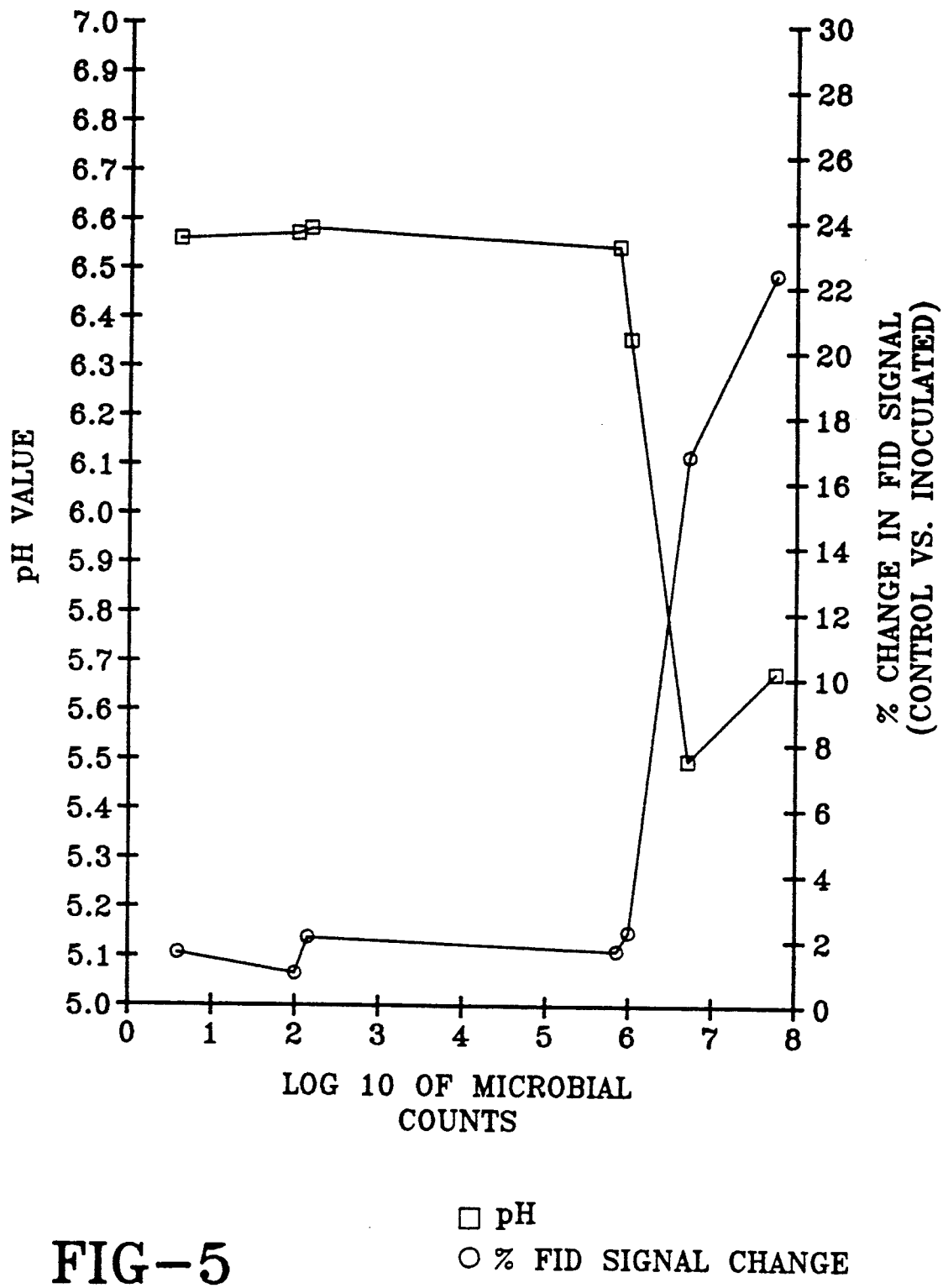
FIG. 5 is a graph presenting the percentage decrease in free induction decay signal compared to microbial count, as well as pH compared to microbial count for a third nutritional product.

Further verification of the advancement in non-destructive testing for spoilage in a nutritional product as determined by the method of the present invention can be appreciated from FIGS. 3, 4 and 5. Each of these three figures is a graph which in addition to presenting the percentage of decrease in FID signal between a control sample and inoculated samples, all of the samples in an example being from the same product batch, when compared to log 10 of microbial counts, also disclose changes in the pH value of the inoculated nutritional product arrived at by a contemporaneous destructive test.

For example, FIG. 3 discloses a graph of strawberry flavored Ensure Plus ® which has been inoculated with *Staphylococcus aureus*. The lower portion of the graph indicates that as the microbial count increases, there comes a point in time when there is a rapid increase in FID. This point of rapid increase in FID corresponds to the detection of microbial contamination based upon changes in pH value. It should be noted that just as rapidly as the pH changes, the method of the present invention provides an indication that spoilage has in fact occurred.

FIG. 4 discloses chocolate flavored Enrich ® which has been contaminated with *Clostridium sporogenes*. Enrich ® is a fiber-containing, nutritionally complete liquid food which is available from Ross Laboratories, a division of Abbott Laboratories U.S.A., Columbus, Ohio U.S.A. Once again, the bottom portion of the graph in FIG. 4 shows that the FID remained fairly constant until the microbial count reached between $10^7$ and $10^8$, at which time, a dramatic increase in the % change of FID signal was indicated. Had these values been plotted similarly to that of FIG. 1, when the microbial count was between $10^7$ and $10^8$ a decline in the peak FID value would have been shown. Returning to FIG. 4, again it should be noted that the invasive testing of the product's pH confirms the fact that spoilage had occurred when the microbial count was between $10^7$ and $10^8$. For example, in chocolate flavored Enrich ® contaminated with *Clostridium sporogenes*, a change of only 0.5 in the pH resulted in a 25% change in the FID value.

Finally, FIG. 5 presents results for vanilla flavored Ensure ® which has been contaminated with *Clostridium sporogenes*. It can be observed that when the microbial count reached between $10^6$ and $10^7$ a dramatic increase in the FID signal occurred, with that increase actually having begun at the time of the fifth reading. Similarly, it should be noted that a comparison of the pH values associated with this contaminated sample disclose a lowering of the pH value consistent with contamination being indicated. The test results presented in FIGS. 1-5 show that the rate of spoilage is somewhat dependent upon the nutritional product matrix as well as being somewhat dependent upon the type of microorganism present as a contaminant.

It should be noted that in all of the above tests, the samples were incubated at approximately 25° C. This is because subjecting a product to nuclear magnetic resonance spectroscopy at different temperatures results in different peak FID values. Therefore, it is important for consistency to subject the samples to nuclear magnetic resonance spectroscopy at approximately the same temperature each time they are tested. Furthermore, preferably the samples should be tested at least on a regular basis in order to provide for an accurate determination as to when spoilage occurs.

The FID signal associated with the present invention is a 90 pulse sequence. There are other pulse sequences such as a 90—90 pulse sequence, as well as a 90-180 pulse sequence. The 90—90 pulse sequence is related to a quantity designated TI, the spin-lattice relaxation rate. Similarly, the 90-180 pulse sequence gives information on a quantity designated T2, the spin-spin relaxation rate. Samples of Similac ®, one of which was inoculated with *Bacillus circulans (BC)*, and the other of which was inoculated with *Bacillus megaterium (BM)* had their other pulse sequences measured. The results are set forth below in Table 1. Just as spoilage was indicated by a larger change in the percentage decrease in FID signal, so too spoilage was indicated by increases in both the T1 and T2 values.

TABLE 1

|  |  | Day 1 | Day 2 | Day 3 |
|---|---|---|---|---|
| T1 Values | Control (Sterile) | 237.4 | 232.3 | 237.7 |
|  | BC | 278.7 | 287.5 | 303.5 |
|  | BM | 259.5 | 289.4 | 317.1 |
| T2 Values | Control (Sterile) | 30.5 | 28.9 | 30.6 |
|  | BC | 29.6 | 30.7 | 35.1 |
|  | BM | 30.6 | 31.5 | 33.6 |

In actual practice, the method of this invention comprises the steps of subjecting a nutritional product in a sealed container to nuclear magnetic resonance spectroscopy. The disclosed method of determining spoilage is especially advantageous if the nutritional product is packaged in a sealed non-metallic container and has been sterilized by aseptic processing. In the preferred embodiment of the invention the peak free induction decay value associated with an initial nuclear magnetic resonance spectroscopy of the nutritional product is recorded. Subsequently, the nutritional product is subjected to further nuclear magnetic resonance spectroscopy and at least one other peak free induction decay value associated with the nuclear magnetic resonance spectroscopy of the nutritional product is recorded.

Of course, it is preferable to record all peak free induction decay values made in connection with subsequent subjecting of the nutritional product to nuclear magnetic resonance spectroscopy. Most preferably this is accomplished using software and control charting. In control charting, a sample of readings is taken on a plurality of containers having nutritional product sealed therein. Thus the sample may include twenty to thirty containers and their respective readings. An average reading is then calculated, as well as a standard deviation. Over time, control charting typically utilizes both a moving average and a moving standard deviation as new readings are taken. If a reading value falls outside the acceptable range, based on the existing standard deviation and average value, then that container of nutritional product is rejected. Furthermore, the value associated with the rejected reading is not incorporated into either the moving average or the moving standard deviation. This method gives an almost instantaneous indication of spoilage, such that it can be used in an automated system.

Alternatively, as shown in the drawings, the various peak FID values, or at least the two values set forth above, can be plotted as points on a graph preferably having an X-axis and a Y-axis. The peak free induction decay values are plotted along the Y-axis while time is plotted along the X-axis. It is therefore possible to determine based upon the graph points whether spoilage of the nutritional product is indicated by the fact that spoilage is indicated by a trend towards a decline in the peak free induction decay values.

Preferably subjecting the nutritional product to nuclear magnetic resonance spectroscopy is done on a regular basis. Additionally, a sample set could be monitored daily over the incubation. Still further, subjecting the nutritional product to nuclear magnetic resonance spectroscopy should be performed when the temperature of the nutritional product is approximately the same as it was at the time of the initial evaluation of the nutritional product using nuclear magnetic resonance spectroscopy and preferably the temperature of the nutritional product is the same as the temperature of the nutritional product at the time of the initial testing.

Industrial Applicability

The food product industry, especially those manufacturers concerned about spoilage in nutritional products packaged using aseptic processing, has long sought to provide a rapid yet reliable non-destructive method for the detection of spoilage. Particular applicability of the present invention can be found in testing for spoilage of pediatric or medical nutritional products. The method of the present invention solves the long-felt need by providing a method which can efficiently check a large number of sealed non-metallic containers for the presence of spoilage.

For example, the method of this invention permits checking containers in an on-line capability. It is estimated that readings can be made in a time period of less than 1/10 of a second per container. With batches of nutritional products often comprising upwards of 250,000 containers, all the containers in a given batch could be tested for spoilage in less than one day.

Additionally, since a nutritional product packaged using an aseptic process may need to be tested for spoilage over an indeterminate period of time, which period could be well in excess of a year, the present invention provides a method having the potential for use in an automated system. Given the number of containers which need to be tested for spoilage, the industry needs a non-destructive inspection method which can be used in an automated environment.

While the form of method herein described constitutes a preferred embodiment of this invention, it is to be understood that the invention is not limited to this precise form of method and that changes may be made therein without departing from the scope of the invention which is defined in the appended claims.

We claim:

1. A non-destructive method of detecting microbial growth resulting in spoilage of a nutritional product, the method comprising the steps of:
   (a) providing a sealed non-metallic container which contains a nutritional product having a water activity of at least 0.9;
   (b) subjecting the nutritional product in the sealed container to nuclear magnetic resonance spectroscopy and determining a peak free induction decay value associated with the nutritional product;
   (c) thereafter subjecting said nutritional product to nuclear magnetic resonance spectroscopy at least one more time and determining at least one other peak free induction decay value associated with the nuclear magnetic resonance spectroscopy of the nutritional product; and
   (d) determining based on a comparison of the peak free induction decay values determined in steps (b) and (c) whether spoilage of the nutritional product is indicated.

2. A non-destructive method of detecting microbial growth resulting in spoilage of a nutritional product according to claim 1 wherein the nutritional product is selected from the group consisting of pediatric and medical nutritional products.

3. A non-destructive method of detecting microbial growth resulting in spoilage of a nutritional product according to claim 1 wherein said spoilage of the nutritional product is indicated by a trend towards a decline in the peak free induction decay values.

4. A non-destructive method of detecting microbial growth resulting in spoilage of a nutritional product according to claim 1 wherein said nutritional product has been packaged in said container using aseptic processing.

5. A non-destructive method of detecting microbial growth resulting in spoilage of a nutritional product having a water activity of at least 0.9, the method comprising the steps of:
 (a) providing a sealed non-metallic container which contains said product having a water activity of at least 0.9;
 (b) subjecting said nutritional product in the sealed container to nuclear magnetic resonance spectroscopy and determining a peak free induction decay value associated with said nutritional product;
 (c) comparing the peak free induction decay value determined in step (b) with the peak free induction decay value associated with at least one control sample of the nutritional product which is know to be free of microbial contamination; and
 (d) determining based on the comparison of the peak free induction decay values whether spoilage of said nutritional product is indicated.

6. A non-destructive method of detecting microbial growth resulting in spoilage of a nutritional product according to claim 5 wherein the nutritional product is subjected to nuclear magnetic resonance spectroscopy at regular intervals, wherein said spoilage of the nutritional product is indicated by a trend towards an increase in the relaxation rate of the protons associated with the nuclear magnetic resonance spectroscopy of the nutritional product, and wherein said relaxation rate is quantified by the free induction decay signal.

7. A non-destructive method of detecting microbial growth resulting in spoilage of a nutritional product according to claim 5 wherein said nutritional product has been packaged in said container using an aseptic process.

8. A non-destructive method of detecting microbial growth resulting in spoilage of a nutritional product according to claim 5 wherein said spoilage of the nutritional product is indicated by an increase in the magnitude of the change in the peak free induction decay values, wherein said peak free induction decay measurements exhibit a trend towards smaller values with an increasing degree of microbial spoilage.

9. A non-destructive method of detecting microbial growth resulting in spoilage of a nutritional product, the method comprising the steps of:
 (a) providing a sealed non-metallic container which contains said nutritional product having a water activity of at least 0.9;
 (b) subjecting said nutritional product in the sealed container to nuclear magnetic resonance spectroscopy and measuring the relaxation rate of the protons associated with said nutritional product;
 (c) comparing the proton relaxation rates determined in step (b) with proton relaxation rates for at least one control sample of the nutritional product which is known to be free of microbial contamination; and
 (d) determining based on the comparison of proton relaxation rates whether spoilage of said nutritional product is indicated.

10. A non-destructive method of detecting microbial growth resulting in spoilage of a nutritional product according to claim 9 wherein said spoilage of the nutritional product is indicated by an increase in the relaxation rate of the protons associated with the nuclear magnetic resonance spectroscopy of the nutritional product.

11. A non-destructive method of detecting microbial growth resulting in spoilage of a nutritional product according to claim 9 wherein said nutritional product has been packaged in said container using an aseptic process.

12. A non-destructive method of detecting microbial growth resulting in spoilage of a nutritional product according to claim 9 wherein said relaxation rate is quantified by the free induction decay signal.

* * * * *

UNITED STATES PATENT AND TRADEMARK OFFICE
CERTIFICATE OF CORRECTION

PATENT NO. : 5,270,650
DATED : December 14, 1993
INVENTOR(S) : T. Schenz, K. Courtney, B. Israel, L. Reaves It is certified that error appears in the above-identified patent and that said Letters Patent is hereby corrected as shown below:

Column 11, line 24, "know" should be --known--.

Signed and Sealed this

Twelfth Day of July, 1994

Attest:

BRUCE LEHMAN

*Attesting Officer*     *Commissioner of Patents and Trademarks*